United States Patent
Zhu et al.

(10) Patent No.: US 10,187,602 B2
(45) Date of Patent: Jan. 22, 2019

(54) CURRENT INJECTION FOR FAST RAMP START-UP DURING ANALOG-TO-DIGITAL OPERATIONS

(71) Applicant: OmniVision Technologies, Inc., Santa Clara, CA (US)

(72) Inventors: Fan Zhu, San Jose, CA (US); Yu-Shen Yang, San Jose, CA (US); Yingkan Lin, San Jose, CA (US); Zejian Wang, Sunnyvale, CA (US); Liping Deng, Cupertino, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/034,226

(22) Filed: Jul. 12, 2018

(65) Prior Publication Data
US 2018/0324377 A1   Nov. 8, 2018

Related U.S. Application Data

(62) Division of application No. 15/376,352, filed on Dec. 12, 2016, now Pat. No. 10,051,225.

(51) Int. Cl.
*H04N 5/378* (2011.01)
*H03M 1/34* (2006.01)
*H03K 4/90* (2006.01)
*H03M 1/56* (2006.01)

(52) U.S. Cl.
CPC ............ *H04N 5/378* (2013.01); *H03K 4/90* (2013.01); *H03M 1/34* (2013.01); *H03M 1/56* (2013.01)

(58) Field of Classification Search
CPC .......... H04N 5/378; H03M 1/34; H03M 1/56; H03K 4/90
See application file for complete search history.

(56) References Cited

U.S. PATENT DOCUMENTS

| 5,315,199 | A | 5/1994 | McCracken et al. | |
|---|---|---|---|---|
| 5,973,522 | A * | 10/1999 | Coy | G06J 1/00 327/131 |
| 7,230,561 | B2 * | 6/2007 | Lee | G06J 1/00 341/144 |
| 2017/0373595 | A1 * | 12/2017 | Huang | H02M 3/158 |

OTHER PUBLICATIONS

ROC (Taiwan) Patent Application No. 106143390—Taiwanese Office Action and Search Report, dated Aug. 6, 2018, with English translation (18 pages).

* cited by examiner

*Primary Examiner* — Mekonnen D Dagnew
(74) *Attorney, Agent, or Firm* — Christensen O'Connor Johnson Kindness PLLC

(57) ABSTRACT

An example method for fast ramp start-up during analog to digital conversion (ADC) includes opening a feedback bypass switch coupled to an amplifier to initiate an ADC operation, providing an injection current pulse to an inverting input of the amplifier, where the non-inverting input is coupled to a feedback bypass switch, integrating a first reference current coupled to the inverting input of the amplifier, where the integrating of the first reference current occurs due to the opening of the feedback bypass switch, and providing a reference voltage in response to the injection current pulse, the integrating of the first reference current, and a reference voltage coupled to a non-inverting input of the amplifier, where a level of the reference voltage is increased at least at initiation of the ADC operation in response to the injection current pulse.

6 Claims, 3 Drawing Sheets

US 10,187,602 B2

CURRENT INJECTION FOR FAST RAMP START-UP DURING ANALOG-TO-DIGITAL OPERATIONS

CROSS-REFERENCE TO RELATED APPLICATIONS

This application is a divisional of U.S. patent application Ser. No. 15/376,352, filed on Dec. 12, 2016, now pending. U.S. patent application Ser. No. 15/376,352 is hereby incorporated by reference.

TECHNICAL FIELD

This disclosure relates generally to image sensors, and in particular but not exclusively, relates to increased ramp voltage start up for an image sensor.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

Image sensors conventionally receive light on an array of pixels, which generates charge in the pixels. The intensity of the light may influence the amount of charge generated in each pixel, with higher intensity generating higher amounts of charge. The charge may be converted into a digital representation of the charge by analog-to-digital converter (ADC) circuits in the image sensor based on a comparison to a reference voltage signal. However, in low light and dark scenarios, the voltage generated due to the charge may not be reliably read because of one or more settling times of the reference voltage. The settling time(s) may affect how soon the voltage may be converted and how accurate the conversion is.

Many techniques have been employed to settling times of the reference voltage. However, some of these techniques may not provide the desired result.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
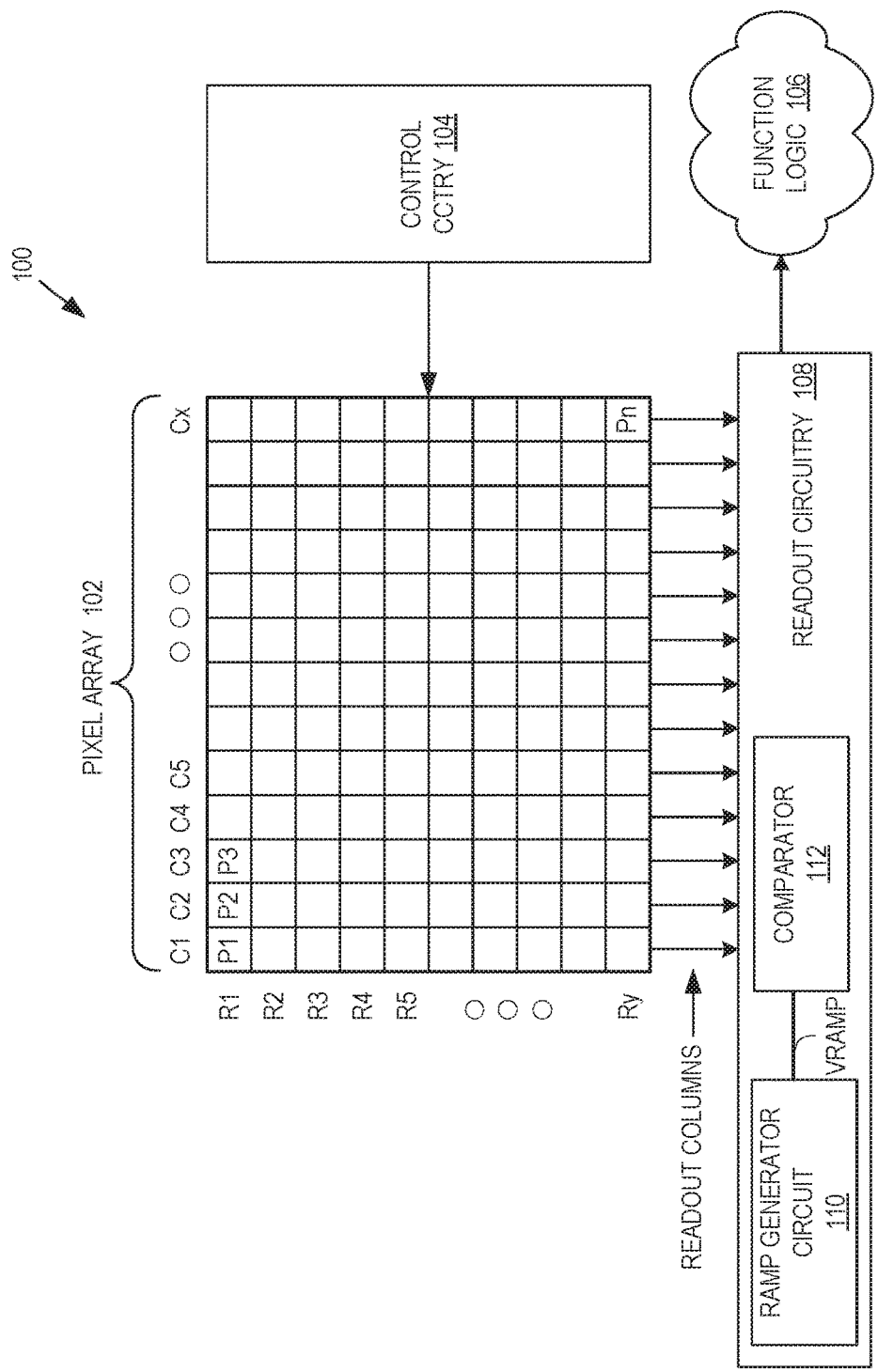
FIG. 1 illustrates one example of an imaging system in accordance with an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with increased ramp voltage start-up are described herein. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 illustrates one example of an imaging system 100 in accordance with an embodiment of the present disclosure. Imaging system 100 includes pixel array 102, control circuitry 104, readout circuitry 108, and function logic 106. In one example, pixel array 102 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 102 has acquired its image charge through photogeneration of the image charge, corresponding image data is readout by readout circuitry 108 and then transferred to function logic 106. Readout circuitry 108 may be coupled to readout image data from the plurality of photodiodes in pixel array 102. In various examples, readout circuitry 108 may include amplification circuitry, analog-to-digital (ADC) conversion circuitry, or otherwise. In some embodiments, a ramp generator circuit 110 and one or more comparators 112 may be included in the readout circuitry 108. In some embodiments, there may be a comparator 112 for each readout column, and the ramp generator circuit 110 may provide a reference voltage VRAMP to each comparator 112. Function logic 106 may simply store the image data or even manipulate the image data by applying post image effects (e.g., crop, rotate, remove red eye, adjust brightness, adjust contrast, or otherwise). In one example, readout circuitry 108 may readout a row of image data at a time along readout column lines (illustrated) or may readout the image data using a variety of other techniques (not illustrated), such as a serial readout or a full parallel readout of all pixels simultaneously.

To perform ADC, for example, the ramp generator circuit 110 may provide VRAMP to the comparator 112 associated with each readout column. Image data from a pixel of the pixel array 102 may also be received by a respective comparator 112. The comparator 112 may determine a digital representation of the image data based on a comparison of VRAMP to the image data during an ADC operation. The signal VRAMP may be at various voltage levels depending on the timing of the ADC operation. In some embodiments, VRAMP may be at one or more reference voltage levels prior to linearly decreasing during the ADC operation. The linear decrease may have a negative slope. At the transition corner, which may also be referred to as the "corner," where VRAMP transitions from level to the negative ramp, of VRAMP as it begins to linearly decrease, the voltage level may decrease some due to the load placed on the ramp generator circuit 110 by the comparator 112 of each readout column. In general, it may be desirable for the VRAMP voltage to have as sharp a corner as possible, which may allow for quicker ADC operations and more certain ADC operations, especially of dark and low light scenarios. The time it takes for the voltage to increase to an ideal level, which may be referred to as a settling time, may affect the ADC operations. To shorten the settling time and to ensure quicker, more accurate ADC operations, e.g., image data readings, the ramp generator circuit 110 may increase VRAMP at least at the corner to hasten, e.g., shorten, the settling time. In some embodiments, a current injection pulse may be provided to an inverting input of an amplifier at least at the start of the ADC operation to shorten the settling time. Although ramp generator 110 is shown as a separate block of the imaging system 100, ramp generator 110 may be included in other blocks, such as the column readout circuit 108, or a voltage generator block (not shown).

In one example, control circuitry 104 is coupled to pixel array 102 to control operation of the plurality of photodiodes in pixel array 102. For example, control circuitry 104 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 100 may be included in a digital camera, cell phone, laptop computer, or the like. Additionally, imaging system 200 may be coupled to other pieces of hardware such as a processor (general purpose or otherwise), memory elements, outputs (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, or manipulate image data supplied by imaging system 200.

Figure 2A:
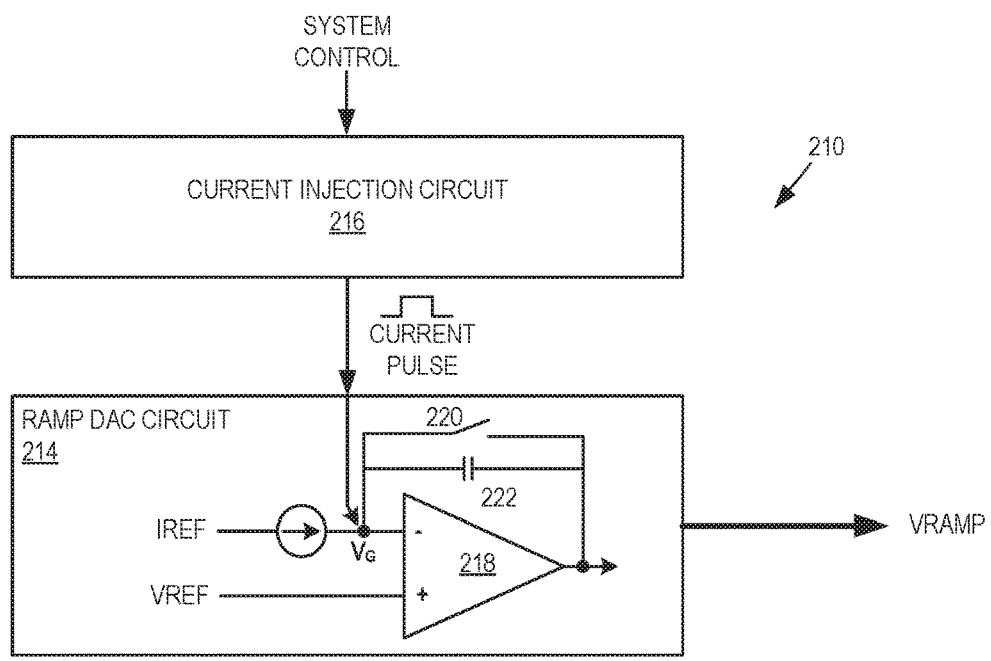
FIG. 2A is an example block diagram of a ramp generator circuit in accordance with an embodiment of the present disclosure.

FIG. 2A is an example block diagram of a ramp generator circuit 210 in accordance with an embodiment of the present disclosure. The ramp generator circuit 210 may be an example of the ramp generator circuit 110. The ramp generator circuit 210 may provide a reference voltage VRAMP to one or more comparators, such as the comparator 112, to perform an ADC operation, for example.

The illustrated embodiment of the ramp generator circuit 210 includes a ramp digital-to-analog (DAC) circuit 214, and a current injection circuit 216. The ramp DAC circuit 214 may provide the reference voltage VRAMP, and may receive a current injection pulse at least during a portion of an ADC operation. The current injection circuit 216 may provide the current injection pulse to the ramp DAC circuit 214. In some embodiments, the current injection pulse may be provided during an initial portion of the ADC operation. In some embodiments, the current injection pulse may be provided for a duration of the ADC operation.

The illustrated embodiment of the ramp DAC circuit 214 includes at least an amplifier 218, a capacitor 222, and a switch 220. The amplifier 218 may be coupled to receive a reference voltage on a non-inverting input and a constant current reference on an inverting input. Additionally, the inverting input may be coupled to receive negative feedback through the capacitor 222 depending on the state of the switch 220. A node $V_G$ may be defined where the current reference and the feedback may be coupled to the inverting input of the amplifier 218. The node $V_G$ may also be coupled to receive the injection current pulse from the injection current circuit 216.

The current injection circuit 216 may receive a constant reference current from a reference current source, which may be different than IREF of the ramp DAC circuit 214. The current injection circuit 216 may then condition the constant reference current in response to one or more control signals. The one or more control signals may be received from an external controller, such as control circuitry 108, or generated by a controller included in the current injection circuit 216. In some embodiments, the current injection circuit 216 may generate a derivative of the constant reference current based on the one or more control signals. The derivative, for example, may be based on various fractional multipliers of the constant current source. The derivative of the constant current source may be referred to as an "injection current." The injection current may be continuously generated by the current injection circuit 216 in some embodiments, and provided to the ramp DAC circuit 214 in the form of a pulse, for example.

The current injection circuit 216 may then gate the injection current to a desired width to provide a desired injection current pulse. In some embodiments, the injection current pulse may be adjusted to account for an amount of voltage reduction occurring at the node $V_G$ due to an ADC operation. In some embodiments, the injection current pulse may be provided to the ramp DAC circuit 214 in response to another one of the externally provided control signals. In some embodiments, the other control signal may additionally control the switch 220. For example, a system control signal may cause an injection current pulse to be provided to the ramp DAC circuit 214, and may also open the switch 220. Opening of the switch 220 may initiate an ADC operation, for example, by causing the integration of VRAMP. Further, the other control signal may also cause the injection current to be provided to a current sink at times when an ADC operation is not being performed. In some embodiments, a current sink may be included in the current injection circuit 216.

In some embodiments, it may be desirable for the current injection circuit 216 to continuously and constantly be generating the injection current at a desired level, e.g., amplitude, even when an injection current pulse is not being provided to the ramp DAC circuit 214. By continuously and constantly maintaining the desired level of the injection current, the injection current may be ready when the ADC operation is to be performed and no delay may be encountered waiting for the injection current to increase to the desired level. The operation of the ramp generation circuit 210 will be discussed with relation to FIG. 2B.

Figure 2B:
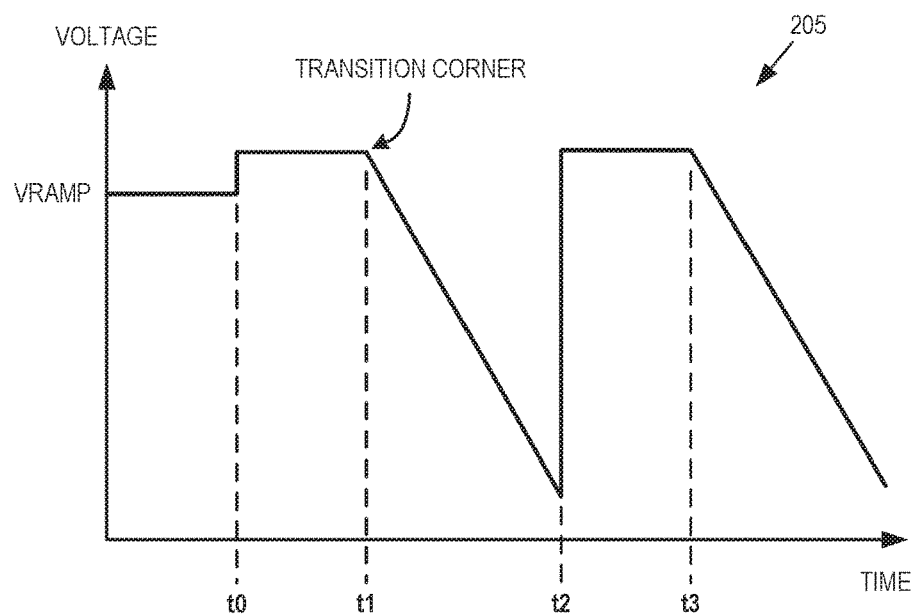
FIG. 2B is an example timing diagram in accordance with an embodiment of the present disclosure.

FIG. 2B is an example timing diagram 205 in accordance with an embodiment of the present disclosure. The timing diagram depicts the change in VRAMP over time. Prior to time t0, the ramp DAC circuit 214 may provide VRAMP at a first voltage level, which may be based on the reference voltage VREF. At time t0, VRAMP may be increased by an (optional) offset voltage, which may be added to VREF by the ramp DAC circuit 214. The offset voltage may be added to VRAMP to increase an available voltage range for an ADC operation, and to drive transistors of a receiving comparator, such as the comparator 112, into saturation.

At time t1, an ADC operation begins due to VRAMP providing the negative ramp voltage. To initiate the ADC operation, the switch 220 may be opened in response to a control signal, for example. Opening the switch 220 may cause negative feedback to be provided to the node $V_G$ by the capacitor 222, which may further cause the integration of the reference current IREF. Additionally at time t1, a current injection pulse may be provided to node $V_G$ by the current injection circuit 216. The addition of the current injection pulse to the node $V_G$ may cause the settling time of VRAMP to shorten and provide the sharp transition corner occurring at time t1.

At time t2, the control switch 220 is closed, which may be in response to the control signal, ending the ADC operation. Additionally, the current injection pulse may also end at time t2. At time t3, a second ADC operation may occur. After the second ADC operation, the two ADC operations may be combined, averaged or subtracted for example, to reduce noise in the image data, for example.

Figure 3:
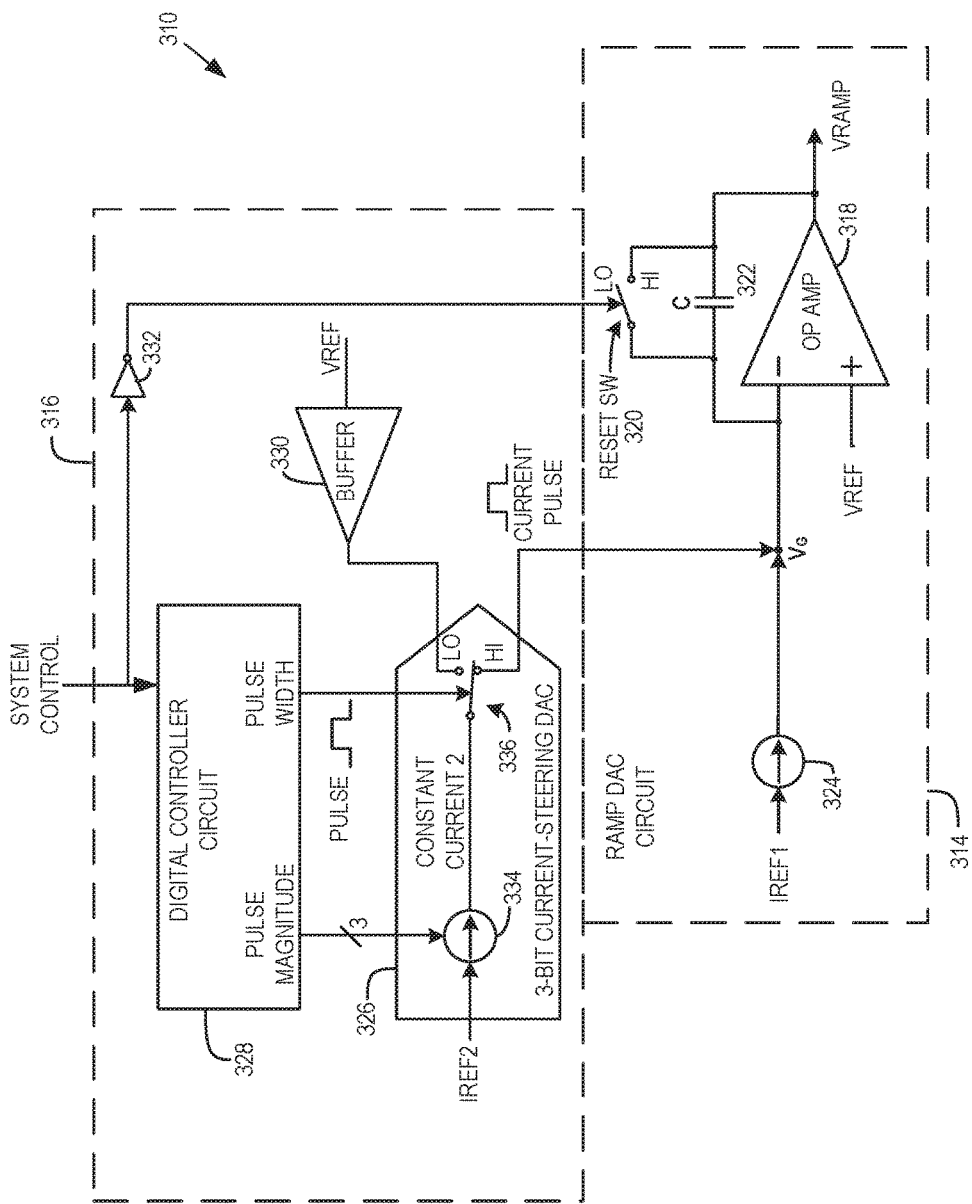
FIG. 3 is an example schematic of a ramp generator circuit in accordance with an embodiment of the present disclosure.

FIG. 3 is an example schematic of a ramp generator circuit 310 in accordance with an embodiment of the present disclosure. The ramp generator circuit 310 may be an example of the ramp generator circuits 110 and/or 210. The ramp generator circuit 310 may provide a time-varying reference voltage VRAMP to one or more comparators, such as comparator 112, to perform ADC operations, for example.

The illustrated embodiment of the ramp generator circuit 310 includes a ramp DAC circuit 314 coupled to a current injection circuit 316. While the two circuits 314 and 316 are discussed as being separate, in some embodiments the two circuits 314 and 316 may be combined to form a single circuit. As such, the depiction of multiple circuits should not be considered limiting. The ramp DAC circuit 314 may generate and provide VRAMP, and the current injection circuit 316 may provide a current injection pulse during at least a portion of an ADC operation. In some embodiments, the current injection pulse may be provided during an initial time period of the ADC operation. In some embodiments, the current injection pulse may be provided for a duration of the ADC operation.

The illustrated embodiment of the ramp DAC circuit 314 may be similar to the ramp DAC circuit 214. The ramp DAC circuit 314 may include an operational amplifier (op amp) 318 coupled to receive a voltage reference VREF on a non-inverting input, and further coupled to receive a first reference current IREF1 from a current source at an inverting input. In some embodiments, the first reference current IREF1 may be at a constant current level. Additionally, the inverting input of the op amp 318 may be coupled to receive negative feedback through a feedback capacitor 322. The feedback capacitor 322 and the first reference current may be coupled to the inverting input via a node $V_G$.

The feedback capacitor 322 may be bypassed at desired times by closing the reset switch 320. In general, closing and opening of the reset switch 320 may be performed to begin and end ADC operations. For example, when the reset switch 320 is closed, the feedback capacitor 322 is bypassed, and the output of the op amp 318, e.g., VRAMP, may follow the voltage level of VREF. However, when the reset switch 320 is opened, the feedback capacitor 322 may cause VRAMP to have a negative ramp, see FIG. 2B for example, which may be due to the integration of IREF1 because of the feedback capacitor 322 providing negative feedback to node $V_G$.

The illustrated embodiment of the current injection circuit 316 includes a digital controller 328, a 3-bit current-steering DAC 326, a buffer 330, and an inverter 332. The digital controller 328 may provide one or more control signals to provide a desired injection current pulse, such as a pulse magnitude control signal and a pulse width control signal. For example, the digital controller 328 may provide a 3-bit control signal, e.g., the pulse magnitude control signal, to the 3-bit current-steering DAC 326 to control a magnitude, e.g., amplitude, of the injection current. Additionally, the digital controller 328 may provide a second control signal, e.g., the pulse width control signal, to the 3-bit current-steering DAC 326 that determines a pulse width of the current injection pulse. In some embodiments, the pulse width control signal may be based on an operational clock signal. For example, based on a clock frequency of 300 MHz, the pulse width control signal may generate an injection current pulse width ranging from zero to 16 clock cycles, which may convert to 0 to 50 nanoseconds. However, in some embodiments, the pulse width control signal may provide the current injection pulse for a duration of an ADC operation, which may be longer than 16 clock cycles. As such, the pulse width control signal may control the time duration of the ADC operation.

Additionally, the digital controller 328 may receive one or more external control signals, labeled SYSTEM CONTROL in FIG. 3, that may cause the current pulse to be provided to the ramp DAC circuit 314. For example, in response to receiving the SYSTEM CONTROL signal, the digital controller 328 may couple the output of the 3-bit current steering DAC 326 to node $V_G$ for a desired amount of time. A transition to high of the SYSTEM CONTROL signal may cause the digital controller 328 to provide the pulse width control signal, which itself may be a pulse signal. The pulse width control signal may cause the switch 336 to couple the current to node VG for a desired period of time, as noted above. The desired period of time may be for an initial time of the ADC operation, for example, and may long enough to ensure additional current increases the sharpness of the corner of VRAMP, as discussed above. In general, the pulse width control signal may be much shorter than the ADC operation, which may be controller by how long SYSTEM CONTROL remains high. Further, SYSTEM CONTROL signal may be provided to the reset switch 320 via an inverter 332, for example, to open the reset switch 320.

The 3-bit current-steering DAC 326 may be coupled to receive the second reference current IREF2, and generate the injection current in response to the pulse magnitude control signal received from the digital controller 328. The 3-bit current-steering DAC 326 may be a current-steering DAC as is known in the art. In some embodiments, the 3-bit current-steering DAC 326 may include a plurality of transistors that may be enabled/disabled in response to the pulse magnitude control signal. By mixing which of the transistors and the number of transistors that are in an enabled state, the 3-bit current-steering DAC 326 may generate various derivatives of IREF2 and provide the same as the injection current. In general, the pulse magnitude control signal may determine a mixture of transistors to enable to generate the injection current at a desired derivative of o IREF2. In some embodiments, the injection current may be ⅛, ¼, ½, or combinations thereof of IREF2. An example injection current magnitude, e.g., amplitude, range may be 3 to 16 microamps. In some embodiments, the injection current may be continuously and constantly generated (at least while the current injection circuit 316 is enabled) so that there is no time delay in providing the current injection pulse when desired.

The 3-bit current-steering DAC 326 may additionally include a three-terminal switch 336. A first terminal of the switch 336 may receive the injection current, a second terminal may be coupled to the buffer 330, and a third terminal may be coupled to node $V_G$. The pulse width control signal received from the digital controller 328 may control the switch 336. For example, when a current injection pulse is not being provided to the node $V_G$, the pulse width control signal may cause the switch 336 to couple the injection current to the buffer 330. Conversely, however, when a current injection pulse is being provided to the node $V_G$, e.g., during a beginning of an ADC operation, the pulse width control signal may cause the switch 336 to couple the injection current to the node $V_G$. The coupling and decoupling of the injection current to the node $V_G$ may generate the injection current pulse, which may have a width based on an amount of time the switch 336 is coupling the injection current to the node $V_G$.

The buffer 330 may be a current sink that absorbs the injection current. Additionally, the buffer 330 may be included so that the current level of the injection pulse is maintained at a desired level so that there is no change, e.g., reduction, in its level when the current pulse is provided to node $V_G$. Further, the buffer 330 may be provided reference voltage VREF to maintain the same load the current pulse will be injected into. For example, the output of op amp 318 may be at VREF prior to the initiation of the integration, e.g., opening reset switch 320, which may be present on $V_G$ at the beginning of the ADC, and which is also when the current pulse will be provided to $V_G$.

In operation, the ramp DAC circuit 314 may be providing VRAMP to one or more comparators. In some embodiments, VRAMP may be provided to a plurality of comparators, e.g., one comparator for each readout column of an imaging sensor. VRAMP may be provided in response to VREF, and changes thereto, and to IREF1, and changes thereto. FIG. 2B provides an example time-varying VRAMP signal, and will be used to discuss the operation of the ramp generator circuit 310. Prior to time t0, VREF may be provided by the op amp 318 as VRAMP. At time t0, an (optional) offset voltage may be added to VREF, which propagates into VRAMP. The offset voltage may increase an ADC range of the receiving comparators, and may further drive input transistors of the receiving comparators into saturation.

Prior to time t1, the digital controller 328 may be providing the pulse magnitude control signal to the 3-bit current-steering DAC 326 so that the injection current is generated at a desired magnitude. Additionally, the digital controller 328 may be providing the pulse width control signal at a low voltage, which may cause the switch 336 to couple the injection current to the buffer 330. Further, the reset switch 320 may be closed due to SYSTEM CONTROL. As such, the feedback capacitor 322 may be bypassed, which may prevent the integration of IREF1 and the negative slope of VRAMP.

At time t1, SYSTEM CONTROL may transition high, causing the rest switch to open and may cause the digital controller 328 to provide the pulse width control signal to the 3-bit current steering DAC 326. The pulse width control signal may cause the switch 336 to couple the injection current to node $V_G$ for a desired amount of time, 0 to 50 nanoseconds for example. As a result, the feedback capacitor 322 may begin integrating IREF1, which may cause VRAMP to begin the negative slope, which is used for the ADC operation. Additionally, the injection current provided to node $V_G$ may increase the voltage on the inverting input of the op amp 318 for the width of the current pulse, which may increase VRAMP at least during an initial period of the ADC operation, e.g., at the corner where VRAMP begins the negative slope. The injection current, which may be a pulse based on a length of time the switch 336 couples the injection current to node $V_G$, may increase the voltage on node $V_G$ resulting in a shortening of the settling time of the voltage on node $V_G$. The voltage on node $V_G$ may decrease when the reset switch 320 is opened due to the large load on the output of the op amp 318, e.g., due to the plurality of comparators receiving VRAMP. By shortening the settling time, the ADC operation may be more accurate and completed sooner.

At time t2, the SYSTEM CONTROL signal may transition low, which may cause the rest switch 320 to close. As a result, VRAMP may increase back to VREF since the integration of IREF1 may cease. At this point, a first, or initial, ADC operation of image data may be complete.

At time t3, a subsequent ADC operation of the same image data may be performed. To perform the subsequent ADC operation, the pulse magnitude and pulse width control signals may cause the ramp generator circuit 310 to perform as discussed with respect to time t1. The results of the two ADC operations may be combined to reduce noise, for example, in the ADC operation of the image data.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A method, comprising:
   opening, in response to a first control signal, a feedback bypass switch coupled to an amplifier to initiate an analog-to-digital conversion (ADC) operation;
   providing, by a current injection circuit, an injection current pulse to an inverting input of the amplifier, wherein the non-inverting input is coupled to the feedback bypass switch;
   integrating a first reference current coupled to the inverting input of the amplifier, wherein the integrating of the first reference current occurs due to the opening of the feedback bypass switch; and providing, by the amplifier, a reference voltage in response to the injection current pulse, the integrating of the first reference current, and a reference voltage coupled to a non-inverting input of the amplifier, wherein a level of the reference voltage is increased at least at initiation of the ADC operation at least in response to the injection current pulse.

2. The method of claim 1, further comprising:
generating, by the current injection circuit, an injection current in response to a second control signal, wherein the second control signal determines a derivative of a second reference current, the derivative of the second reference current being the injection current.

3. The method of claim 2, further comprising:
coupling, by the current injection circuit, the injection current to the inverting input of the amplifier through a switch in response to a third control signal, wherein a time period the injection current is coupled to the inverting input of the amplifier determines a width of the injection current pulse.

4. The method of claim 3, further comprising:
closing, in response to the first control signal, the feedback bypass switch coupled to the amplifier to end the ADC operation; and
coupling, in response to the third control signal, the injection current to a current sink.

5. The method of claim 1, wherein opening, in response to the first control signal, the feedback bypass switch coupled to the amplifier to initiate the ADC operation comprises coupling an output of the amplifier to the inverting input through a feedback capacitor.

6. The method of claim 1, wherein providing, by the current injection circuit, the injection current pulse to the inverting input of the amplifier comprises:
generating, from a second reference current, the injection current by a current-steering digital-to-analog converter (DAC) in response to a second control signal, wherein the second control signal determines a magnitude of the injection current based on the second reference current; and
coupling the injection current to the inverting input of the amplifier through a switch controlled by a third control signal, wherein a length of time the switch couples the injection current to the inverting input of the amplifier generates the injection current pulse, and wherein the third control signal is initiated in response to the first control signal.

* * * * *